(12) United States Patent
Matsuyama

(10) Patent No.: US 8,636,872 B2
(45) Date of Patent: Jan. 28, 2014

(54) UPPER ELECTRODE AND PLASMA PROCESSING APPARATUS

(75) Inventor: Shoichiro Matsuyama, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 158 days.

(21) Appl. No.: 13/372,821

(22) Filed: Feb. 14, 2012

(65) Prior Publication Data

US 2012/0206033 A1 Aug. 16, 2012

Related U.S. Application Data

(60) Provisional application No. 61/449,933, filed on Mar. 7, 2011.

(30) Foreign Application Priority Data

Feb. 15, 2011 (JP) .................................. 2011-029635
Feb. 13, 2012 (JP) .................................. 2012-028429

(51) Int. Cl.
*C23F 1/00* (2006.01)
(52) U.S. Cl.
USPC ................... 156/345.47; 118/723 E; 313/311

(58) Field of Classification Search
USPC ........... 313/311; 216/71; 156/345.44, 345.27, 156/345.47; 118/723 E
See application file for complete search history.

(56) References Cited

U.S. PATENT DOCUMENTS

| | | | | |
|---|---|---|---|---|
| 6,537,419 | B1 * | 3/2003 | Kinnard | 156/345.34 |
| 7,552,521 | B2 * | 6/2009 | Fink | 29/557 |
| 8,261,691 | B2 * | 9/2012 | Yamazawa | 118/723 E |
| 2011/0174778 | A1 * | 7/2011 | Sawada et al. | 216/68 |
| 2011/0226421 | A1 * | 9/2011 | Hayashi | 156/345.44 |

FOREIGN PATENT DOCUMENTS

JP 2000-323456 A 11/2000

* cited by examiner

*Primary Examiner* — Anne Hines
(74) *Attorney, Agent, or Firm* — Pearne & Gordon

(57) ABSTRACT

Plasma uniformity can be improved. An upper electrode 105 for use in a parallel plate type plasma processing apparatus includes a base 105a made of a dielectric material; and a conductive layer 110 formed on at least a part of a surface of the base 105a facing a lower electrode 210 provided in the plasma processing apparatus. Further, the conductive layer 110 having a dense and sparse pattern such that the dense and sparse pattern at an outer portion of the surface of the base 105a facing the lower electrode 210 is denser than at an inner portion thereof.

12 Claims, 12 Drawing Sheets

(a)

(b)

(a)

(b)

(a)

(b)

INNER PERIPHERAL PORTION | GRADATION PORTION | OUTER PERIPHERAL PORTION (c)

UPPER ELECTRODE AND PLASMA PROCESSING APPARATUS

CROSS-REFERENCE TO RELATED APPLICATION

This application claims the benefit of Japanese Patent Application Nos. 2011-029635 and 2012-028429 filed on Feb. 15, 2011 and Feb. 13, 2012, respectively, and U.S. Provisional Application Ser. No. 61/449,933, filed on Mar. 7, 2011, the entire disclosures of which are incorporated herein by reference.

FIELD OF THE INVENTION

The present disclosure relates to an upper electrode for use in a parallel plate type plasma processing apparatus and a plasma processing apparatus having the same.

BACKGROUND OF THE INVENTION

A parallel plate type (capacitively coupled) plasma processing apparatus, an inductively coupled plasma processing apparatus, a microwave plasma processing apparatus or the like has been widely used for performing microprocessing such as etching or film forming process on a processing target object by plasma. Among these apparatuses, in the parallel plate type plasma processing apparatus, a high frequency power is applied to at least one of an upper electrode and a lower electrode facing the upper electrode. As a result, a gas is excited into plasma by electric field energy of the high frequency power, and the microprocessing is performed on the processing target object by the generated electric discharge plasma.

To meet a recent requirement for a higher level of miniaturization, it has become necessary to supply an electric power of a high frequency in a relatively high frequency range of about 100 MHz and generate plasma having high density and low ion energy. If the frequency of the supplied electric power increases, a high frequency current flows along a surface of the (upper or lower) electrode facing the plasma (hereinafter, referred to as a "plasma facing surface") from an edge portion of the electrode toward a central portion thereof by a skin effect. Accordingly, electric field intensity at the central portion of the electrode becomes higher than electric field intensity at the edge portion thereof. As a result, electric field energy consumed to generate plasma at the central portion of the electrode becomes higher than electric field energy consumed to generate plasma at the edge portion of the electrode. Therefore, ionization or dissociation of a gas is accelerated at the central portion of the electrode. Consequently, electron density of the plasma at the central portion of the electrode becomes higher than electron density of the plasma at the edge portion thereof. Since electrical resistivity of plasma is decreased at the central portion of the electrode where the electron density of plasma is high, an electric current caused by high frequency wave (electromagnetic wave) is also concentrated at a central portion of a facing electrode. Therefore, plasma density becomes non-uniform therein.

To solve this problem, there has been proposed burying a dielectric member such as ceramic in a central portion of the plasma facing surface of the electrode in order to improve uniformity of plasma density (see, for example, Patent Document 1).

Patent Document 1: Japanese Patent Laid-open Publication No. 2000-323456

If, however, the dielectric member such as ceramic is buried in the electrode, a stress may be applied to a joint portion between the electrode and the dielectric member due to a difference in their thermal expansion caused by repetitive heating and cooling during a process. As a result, the dielectric member may crack or the inside of a chamber may be contaminated.

In order to further improve plasma uniformity, it has been also proposed to form the dielectric member, which is buried in the electrode, in a tapered shape. In such a case, since a capacitance component at an edge portion of the dielectric member becomes larger than a capacitance component at a central portion thereof, a decrease in electric field intensity at the edge portion of the dielectric member is not great compared to a case of burying a dielectric member having a flat shape in the electrode. Thus, more uniform electric field intensity can be obtained.

If, however, the dielectric member is formed in the tapered shape, dimensional accuracy of a tapered portion may be deteriorated depending on machining accuracy. As a consequence, a stress may be concentrated on the tapered portion of the dielectric member due to a thermal expansion difference or non-uniformity in dimensional tolerance at a joint interface. Due to the stress concentration, a crack of the electrode is more likely to occur, and the inside of the chamber may be easily contaminated with particles or metals.

BRIEF SUMMARY OF THE INVENTION

In view of the foregoing, illustrative embodiments provide an upper electrode and a plasma processing apparatus capable of improving plasma uniformity.

In accordance with one aspect of an illustrative embodiment, there is provided an upper electrode for use in a parallel plate type plasma processing apparatus. The upper electrode includes a base made of a dielectric material; and a conductive layer formed on at least a part of a surface of the base facing a lower electrode provided in the plasma processing apparatus. Further, the conductive layer may have a dense and sparse pattern such that the dense and sparse pattern at an outer portion of the surface of the base facing the lower electrode is denser than at an inner portion thereof.

In this configuration, the upper electrode has the base made of the dielectric material and the conductive layer formed on the surface of the base facing the lower electrode. The conductive layer has a dense and sparse pattern such that the dense and sparse pattern at an outer portion of the upper electrode is denser than at an inner portion thereof. Accordingly, a combined capacity of the upper electrode and a sheath formed between the upper electrode and plasma becomes larger at the outer portion of the upper electrode than at the inner portion thereof. Thus, the same effect obtained by burying a taper-shaped dielectric member in the upper electrode can be achieved, so that plasma uniformity can be further improved.

The dense and sparse pattern may include one of a comb teeth-shaped pattern protruded from the outer portion of the upper electrode toward the inner portion thereof; a crescent-shaped pattern protruded from the outer portion of the upper electrode toward the inner portion thereof; and an opening pattern arranged from the outer portion of the upper electrode toward the inner portion thereof.

A boundary between the conductive layer and the dense and sparse pattern of the conductive layer may be positioned at an inner position than an outer peripheral portion of a wafer mounted on the lower electrode.

A transition portion may be formed at the boundary between the conductive layer and the dense and sparse pattern of the conductive layer such that the transition portion is protruded from an inner portion of the upper electrode toward an outer portion thereof. Further, the conductive layer may become continuously dense from the inner portion of the upper electrode toward the outer portion thereof.

The conductive layer may have a ground potential.

The dense and sparse pattern of the conductive layer may be formed by adjusting at least one of a teeth number of the comb teeth-shaped pattern, a teeth length thereof, and a teeth angle thereof.

The dense and sparse pattern may include at least three different lengths of comb teeth, and a distance from a center of the upper electrode to a leading end of a longest comb tooth may be set to be, e.g., about 35 mm to about 50 mm, a distance from the center of the upper electrode to a leading end of a middle-length comb tooth may be set to be, e.g., about 60 mm to about 90 mm, and a distance from the center of the upper electrode to a leading end of a shortest comb tooth may be set to be, e.g., about 100 mm to about 125 mm.

The base may be made of alumina ($Al_2O_3$) or aluminum nitride (AlN).

The upper electrode may further include a protection layer covering the base and the conductive layer.

A multiple number of gas introducing pipes may be provided to pass through the base of the upper electrode.

In accordance with another aspect of an illustrative embodiment, there is provided a parallel plate type plasma processing apparatus including an upper electrode and a lower electrode arranged to face each other. The upper electrode may include a base made of a dielectric material; and a conductive layer formed on at least a part of a surface of the base facing the lower electrode provided in the plasma processing apparatus. Furthermore, the conductive layer may have a dense and sparse pattern formed such that the dense and sparse pattern at an outer portion of the surface of the base facing the lower electrode may be denser than at an inner portion thereof.

The base may be made of alumina ($Al_2O_3$) or aluminum nitride (AlN).

As discussed above, by using the upper electrode and the plasma processing apparatus in accordance with the illustrative embodiment, plasma uniformity can be improved.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Figure 1:
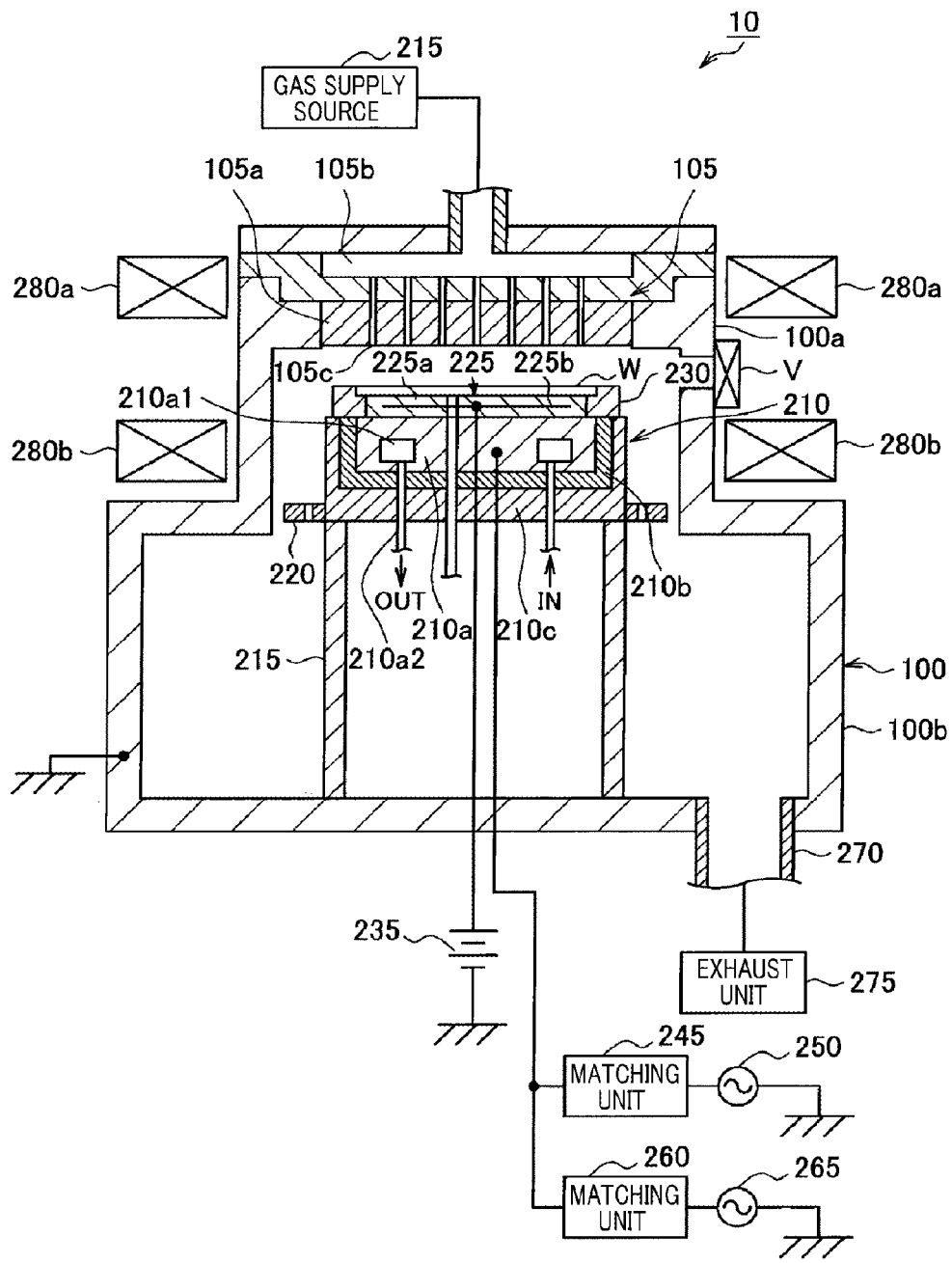
FIG. 1 is a longitudinal cross sectional view of a plasma etching apparatus in accordance with an illustrative embodiment.

Hereinafter, illustrative embodiments will be described with reference to the accompanying drawings. Through the present specification and drawings, parts having substantially same function and configuration will be assigned same reference numerals, and redundant description thereof will be omitted.

(Overall Configuration of Plasma Processing Apparatus)

First, a plasma processing apparatus having an upper electrode in accordance with an illustrative embodiment will be elaborated.

FIG. 1 shows a plasma etching apparatus in accordance with an illustrative embodiment. The plasma etching apparatus 10 is an example parallel plate type plasma processing apparatus and has therein an upper electrode and a lower electrode placed to face the upper electrode.

The plasma etching apparatus 10 has a depressurizable processing chamber 100. The processing chamber 100 includes an upper chamber 100a having a small diameter and a lower chamber 100b having a large diameter. The processing chamber 100 is made of, e.g., a metal such as aluminum and is grounded.

Within the processing chamber 100, an upper electrode 105 and a lower electrode 210 are disposed to face each other, so that a pair of parallel plate type electrodes is provided. A wafer W is loaded into the processing chamber 100 through a gate valve V and mounted on the lower electrode 210. A processing gas is introduced into the processing chamber 100 and plasma is generated by applying a high frequency power. The wafer W mounted on the lower electrode 210 is etched by the plasma.

The upper electrode 105 has an upper base 105a and a gas diffusion space (a conductive base plate) 105b right on the upper base 105a. The upper base 105a and the gas diffusion space 105b form a shower head together. A processing gas is supplied from a gas supply source 215 and diffused in the gas diffusion space 105b. Then, the gas is introduced into the processing chamber 100 through a multiple number of gas holes 105c via a multiple number of gas passages communicated with the gas diffusion space 105b and a multiple number of gas introducing pipe passing through the upper base 105a.

The lower electrode 210 includes a lower base 210a made of a metal such as aluminum, and the lower base 210a is supported by a supporting table 210c via an insulating layer 210b. Thus, the lower electrode 210 is in an electrically floating state from the processing chamber 100. A lower portion of the supporting table 210c is covered with a cover 216. A baffle plate 220 is provided at a lower outer periphery of the supporting table 210c so as to control a gas flow.

A coolant path 210a1 is provided in the lower electrode 210. A coolant is introduced through an inlet of a coolant pipe 210a2 in a direction as indicated by an arrow IN; circulated in the coolant path 210a1; and then discharged through an outlet of the coolant pipe 210a2 in a direction as indicated by an arrow OUT. Accordingly, the lower electrode 210 is controlled to have a desired temperature.

In an electrostatic chuck 225 on top of the lower electrode 210, an electrode member (metal sheet member) 225b is embedded in an insulating member 225a. The electrode member 225b is connected with a DC power supply 235 via a wiring, and a DC voltage outputted from the DC power supply 235 is applied to the electrode member 225b. As a result, the wafer W is electrostatically attracted to the lower electrode 210. A focus ring 230 made of, e.g., silicon is provided at an outer periphery of the electrostatic chuck 225 in order to maintain plasma uniformity.

The lower electrode 210 is connected with a high frequency power supply 250 via a matching unit 245. The high frequency power supply 250 outputs a high frequency power of, e.g., about 100 MHz for plasma generation. The processing gas supplied into the processing chamber 100 is excited by electric field energy of the high frequency power outputted from the high frequency power supply 250. As a result, electric discharge plasma is generated. By the generated electric discharge plasma, an etching process is performed on the wafer W.

The lower electrode 210 is connected with a high frequency power supply 265 via a matching unit 260. The high frequency power supply 265 outputs a high frequency power of, e.g., about 3 MHz or about 13 MHz for bias control. The high frequency power outputted from the high frequency power supply 265 is applied to the wafer W as a bias voltage and is used for attracting ions toward the lower electrode 210.

An exhaust port 270 is provided at a bottom surface of the processing chamber 100, and the inside of the processing chamber 100 is evacuated and maintained at a desired vacuum level by driving an exhaust device 275 connected to the exhaust port 270.

Multi-pole ring magnets 280a and 280b are arranged around the upper chamber 100a. The multi-pole ring magnets 280a and 280b are provided such that a multiple number of columnar anisotropic segment magnets are installed in a ring-shaped magnetic casing and magnetic poles of the adjacent columnar anisotropic segment magnets are alternately reversed. Accordingly, magnetic force lines are formed between the adjacent segment magnets and a magnetic field is formed only at a peripheral portion of a processing space between the upper electrode 105 and the lower electrode 210. As a result, plasma may be confined in the processing space.

Figure 2:
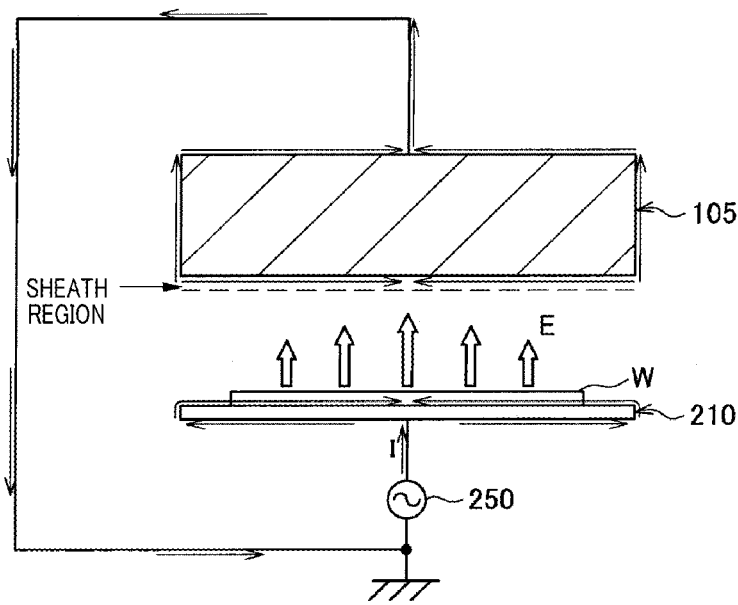
FIG. 2 is a diagram for describing a high frequency power flowing in an electrode.
Figure 2:
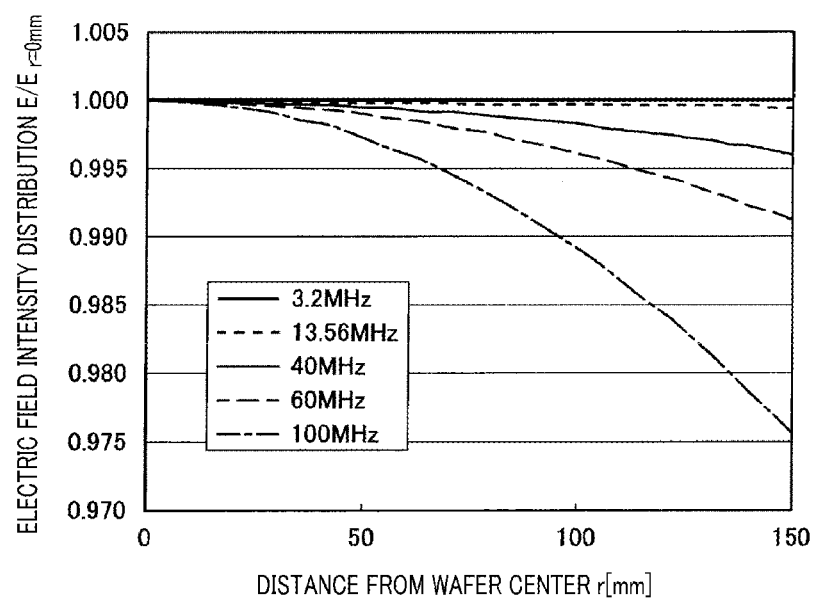

Now, distribution of electric field intensity formed by the upper electrode 105 and the lower electrode 210 will be described. In general, as for a high frequency wave applied to a parallel plate type electrode, A-wave propagates on the lower electrode from a central portion thereof toward an edge portion thereof, whereas B-wave propagates on a plasma facing surface above the lower electrode from the edge portion thereof toward the central portion thereof. A standing wave is generated at a point where the A-wave and the B-wave are superposed. Accordingly, there is generated distribution in which an electric potential (electric field) in the central portion of the electrode becomes high. For this reason, as illustrated in FIG. 2(a), if a high frequency power of, e.g., about 100 MHz is applied to the lower electrode 210 from the high frequency power supply 250, a high frequency current flows on a bottom surface of the lower electrode 210 from a central portion thereof toward an edge portion thereof, and then, flows along a top surface of the lower electrode 210 from an edge portion thereof toward a central portion thereof. Accordingly, electric field intensity at the central portion of the lower electrode 210 becomes higher than electric field intensity at the edge portion of the lower electrode 210. Therefore, ionization or dissociation of a gas is accelerated at the central portion of the lower electrode 210. As a consequence, electron density of plasma at the central portion of the lower electrode 210 becomes higher than electron density of plasma at the edge portion thereof. Since electrical resistivity of plasma is decreased at the central portion where the electron density of plasma is high, an electric current caused by the high frequency wave is also concentrated at the central portion of the upper electrode 105. Therefore, non-uniformity of plasma density is increased. As a result, as illustrated in FIG. 2(b), as the frequency of the high frequency power increases, electric field intensity at a central portion of the wafer becomes higher than electric field intensity at a periphery portion thereof. Especially, since the non-uniformity of electric field intensity is high by using the high frequency power of, e.g., about 100 MHz, the plasma density becomes more non-uniform.

Figure 3:
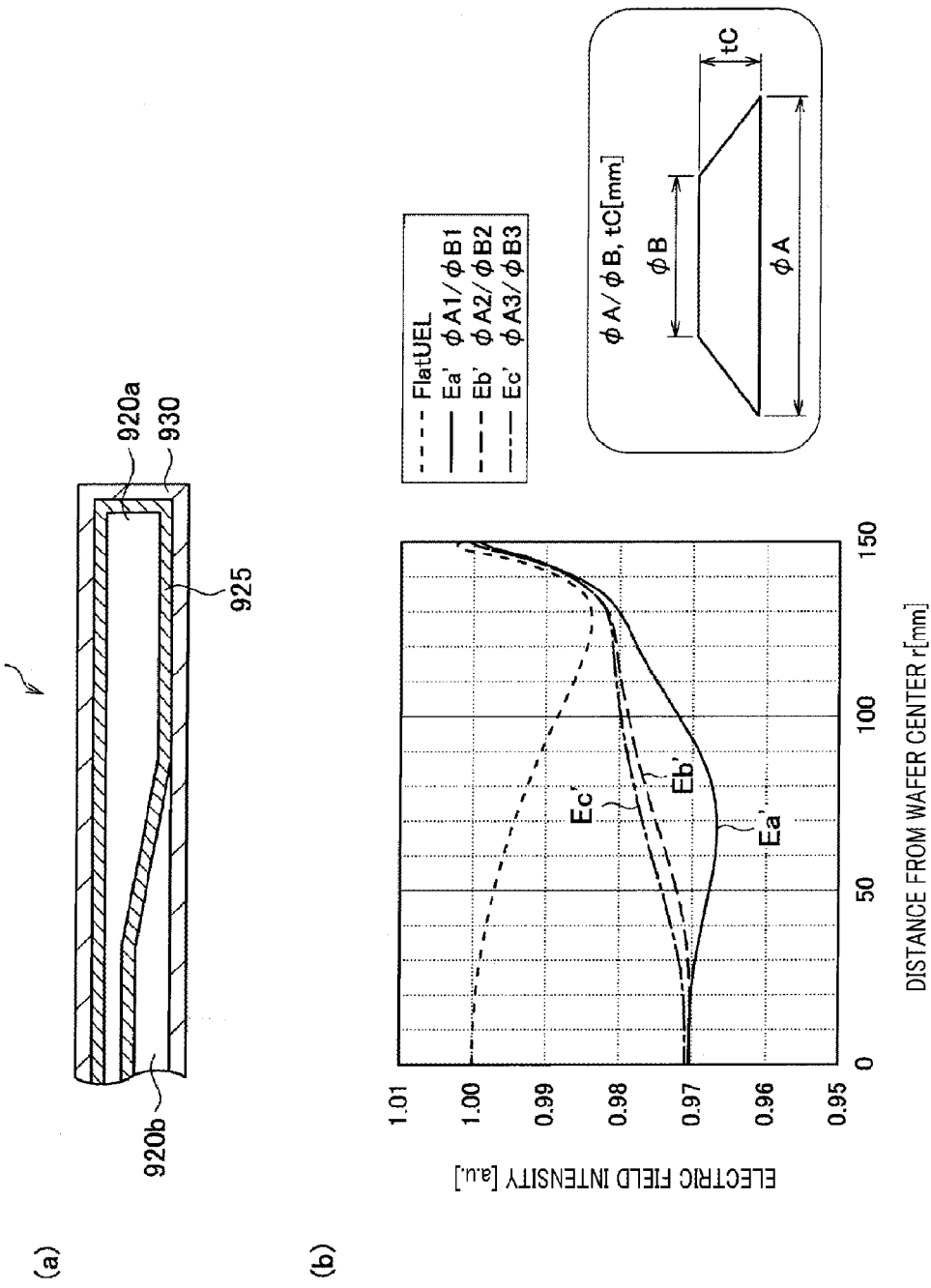
FIG. 3 is a diagram showing electric field intensity in a configuration in which a taper-shaped dielectric member is buried in an electrode.

Now, a basic configuration for improving plasma uniformity in accordance with an illustrative embodiment is illustrated in FIG. 3(a). A structure in which a taper-shaped dielectric member 920b is buried in an electrode (upper electrode 920) will be described. Here, the upper electrode 920 includes a dielectric member (base) 920a covered with a conductor 925. In this case, a central portion of the dielectric member (base) 920a is recessed, and a surface of the dielectric member (base) 920a is covered with the conductor 925. That is, the taper-shaped dielectric member 920b is inserted in a central portion (recess) of a plasma facing surface of the base 920a forming the upper electrode 920 and fixed thereto by the metallic adhesive. Then, by thermally spraying, e.g., yttria ($Y_2O_3$) having high plasma resistance on a surface of the metallic adhesive, a protection layer 930 is formed. Curves Ea', Eb', and Ec' of FIG. 3(b) represent electric field intensities E (a.u.) with respect to a distance r (mm) from a wafer center in respective cases where dielectric members 920b having the same thicknesses and different taper ratios (φA/φB) are inserted in the base 920a. The taper ratios of the dielectric members 920b of the curves Ea', Eb', and Ec' are in a relationship of Ea'<Eb'<Ec'. Here, each taper-shaped dielectric member 920b is made of alumina, and a high frequency power of about 100 MHz for plasma excitation is applied to the lower electrode. In this case, a capacitance at an edge portion of the dielectric member 920b becomes larger than a capacitance at a central portion thereof. As a result, impedance at the edge portion of the dielectric member 920b can be lowered. Thus, as compared when burying a cylindrical dielectric member, an excessive decrease in electric field intensity at the edge portion of the dielectric member can be prevented, so that more uniform electric field intensity can be obtained.

However, it may be very difficult to bond a base and a dielectric member. For example, when bonding a metal base and a ceramic dielectric member by an adhesive, the adhesive may be exposed outside of the base. If more dielectric member adheres to the surface in order to avoid the exposure of the adhesive, a gap may be generated due to a difference in linear expansion coefficients.

For another example, when bonding a dielectric base and a dielectric member covered with a metal film by an adhesive, the adhesive may also be exposed to the surface. Moreover, by way of example, when bonding them by brazing, cracks may occur due to a stress accumulated when a brazed portion is contracted.

Meanwhile, as an example method for improving uniformity of electric field intensity without bonding the dielectric member, an electrode 905 shown in FIG. 4(a) will be described. The electrode 905 includes a base 905a made of a conductor, and an outer peripheral portion of the base 905a is covered with a conductor. In this case, a surface of the outer peripheral portion of the base 905a is covered with a conductive layer 910. Then, an insulating protection layer 915 is formed on a surface of the conductive layer 910 by thermally spraying, e.g., yttria ($Y_2O_3$) having high plasma resistance. That is, the conductive layer 910 is not formed at an inner portion of a plasma facing surface of the base 905a but is only formed in a donut shape at an outer peripheral portion of the plasma facing surface of the base 905a. Curves Ea, Eb, and Ec of FIG. 4(b) represent electric field intensities when donut-shaped conductive layers 910 having different inner diameters are formed on bases 905a having the same size and thickness. The inner diameters corresponding to curves Ea, Eb, and Ec are in a relationship of Ea<Eb<Ec. Each base is made of alumina, and a high frequency power of about 100 MHz for plasma excitation is applied to the lower electrode.

Figure 4:
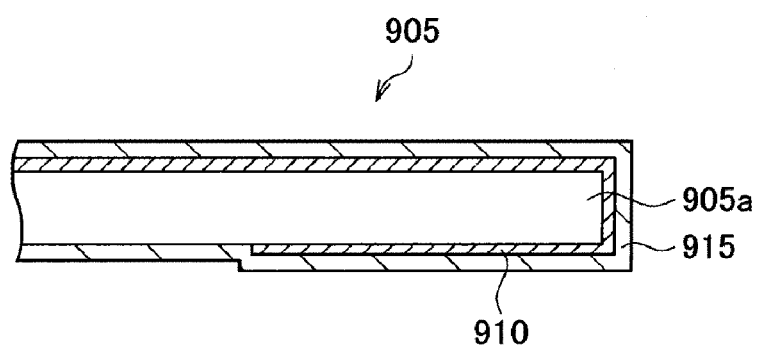
FIG. 4 is a diagram showing electric field intensity in a configuration in which a rectangular dielectric member is buried in an electrode.
Figure 4:
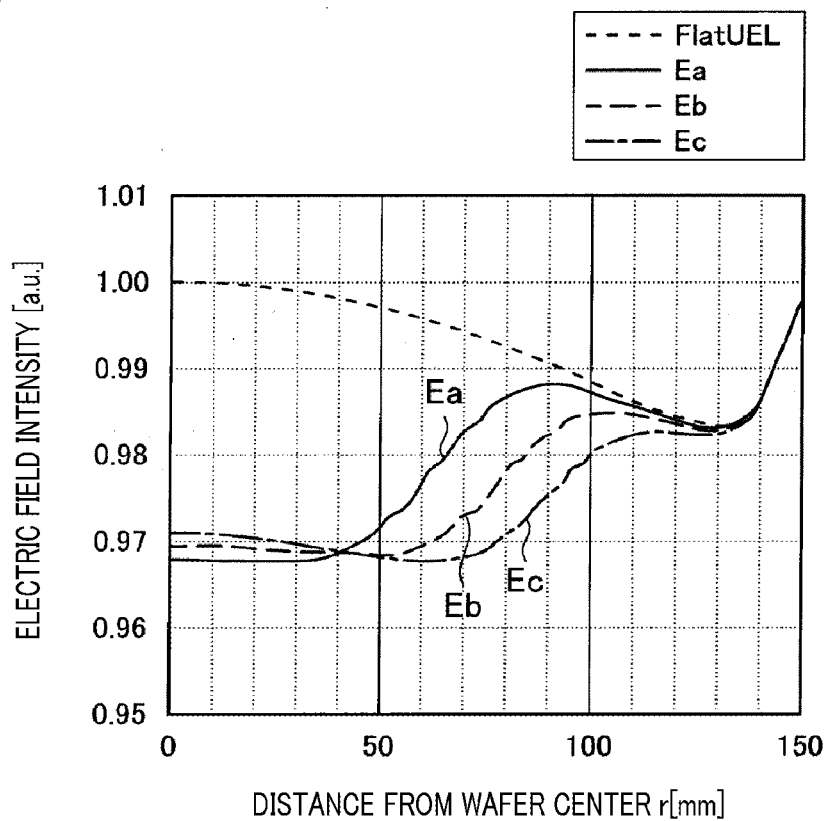

As depicted in FIG. 4(b), as compared to a flat base (flat UEL) without having thereon a conductive layer, the increase of the electric field intensity at a central portion of the plasma facing surface of the electrode 905 is suppressed. Further, uniformity of electric field intensity within the plasma facing surface of the electrode 905 becomes improved. However, in this distribution of electric field intensity, a rapid change is shown near an interface between a portion where the conductive layer 910 is formed and a portion where the conductive layer 910 is not formed. In view of this, just by forming the conductive layer 910 in the donut shape through the surface treatment (forming method) easily performed at the interface between the portion where the conductive layer 910 is formed and the portion where the conducive layer 910 is not formed, it may be not possible to achieve the same effect for the uniformity of electric field intensity as obtained when burying the taper-shaped dielectric member shown in FIG. 3.

(Electrode Structure)

Figure 5:
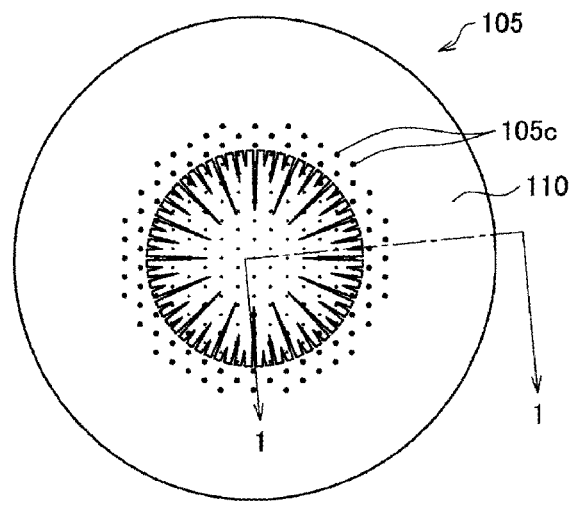
FIG. 5 is a diagram showing electric field intensity in a configuration in which dense and sparse patterns are formed on a conductive layer of an upper electrode in accordance with an illustrative embodiment.
Figure 5:
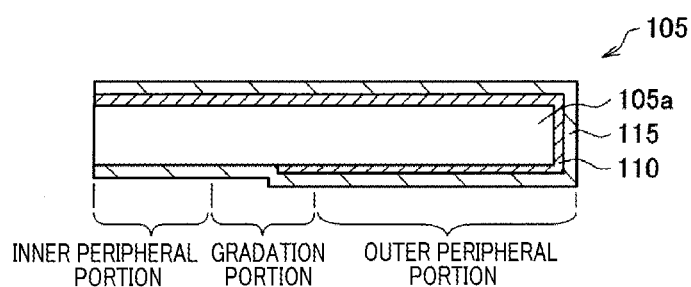
Figure 5:
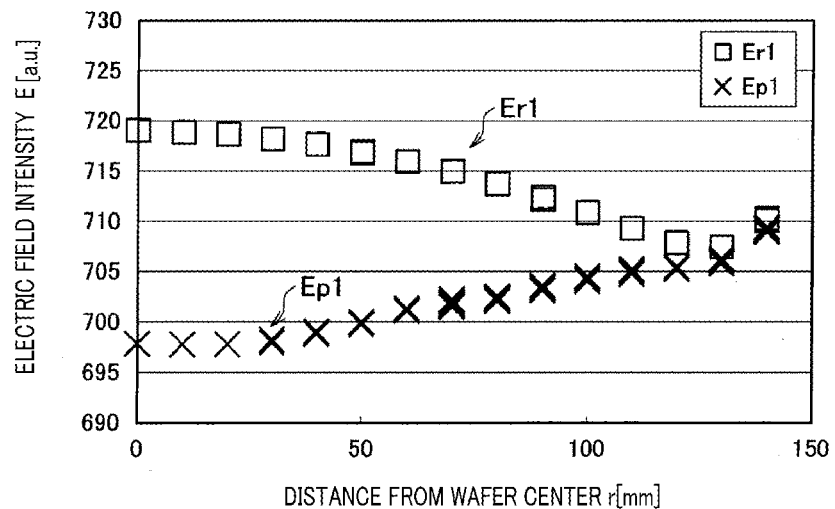

In the upper electrode 105 in accordance with the illustrative embodiment, an outer peripheral portion of a plasma facing surface of the dielectric upper base 105a is covered with the conductive layer, so that a conductive layer is formed. In addition, a certain pattern protruded toward the inside of the base 105a is formed on a surface of the conductive layer. FIG. 5(a) shows a plasma facing surface of the upper electrode 105. FIG. 5(b) is a cross sectional view taken along a line 1-1 of FIG. 5(a).

Referring to FIG. 5(b), the surface of the outer peripheral portion of the upper base 105a is covered with a conductive layer 110. Further, a protection layer 115 is formed on the entire surface of the upper base 105a by thermally spraying, e.g., yttria ($Y_2O_3$) having high plasma resistance. Accordingly, the protection layer 115 covers the upper base 105a and the conductive layer 110.

In the following, the plasma facing surface of the upper electrode 105 will be explained by dividing it into an outer peripheral portion, an inner peripheral portion, and a gradation portion therebetween. The conductive layer 110 is formed on the entire outer peripheral portion, whereas the conductive layer 110 is not formed at the inner peripheral portion (central portion of the electrode).

In the structure of the upper electrode 105 in accordance with the present illustrative embodiment, a dense and sparse pattern formed on the conductive layer 110 shown in FIG. 5(a) is a comb teeth-shaped pattern protruded from an outer portion of the upper electrode 105 toward an inner portion thereof. To elaborate, linear comb teeth having three different lengths are protruded inwardly. Here, 64 comb teeth, each having an angle of about 1°, are radially formed around 360 degrees at a regular interval from the outer peripheral portion of the upper electrode 105 toward the inner portion thereof. The three kinds of comb teeth, i.e., comb teeth having three different lengths, are symmetrically arranged. In this illustrative embodiment, the comb teeth are arranged in an order of a longest comb tooth, a shortest comb tooth, a middle-length comb tooth, a shortest comb tooth, and a longest comb tooth. By way of example, in FIG. 5(a), at the outer peripheral portion, metal density is set to be about 100%; at the gradation portion, metal densities up to the shortest comb tooth, the middle-length comb tooth, and the longest comb tooth are set to be about 80%, about 60%, and about 40%, respectively; and at the inner peripheral portion, metal density is set to be about 0%. In this way, the conductive layer 110 is provided with such a dense and sparse pattern on its plasma facing surface so that the pattern at the outer portion thereof is denser than at the inner portion thereof.

FIG. 5(c) indicates electric field intensity E (a.u.) with respect to a distance r (mm) from a wafer center when the upper electrode 105 having the conductive layer 110 of the above-described pattern is used. In this case, the base is also made of alumina, and a high frequency power of about 100 MHz for plasma excitation is applied to the lower electrode. In this configuration, by forming the conductive layer 110 having the protrusion patterns of different lengths on the intermediate portion (gradation portion) of the plasma facing surface of the upper electrode 105, distribution of electric field intensity can be made gentle and uniform as indicated by a curve Ep1 of FIG. 5(c), which is the same distribution as when burying the taper-shaped dielectric member. An effect of the upper electrode 105 in accordance with the illustrative embodiment is remarkable as compared to a curve Er1 indicating distribution of the electric field intensity when using a flat base. Accordingly, an etching rate of the wafer can be uniformized. Furthermore, in the manufacture of the upper electrode 105 in accordance with the present illustrative embodiment, a bonding process need not be performed. Thus, concentration of a stress due to a thermal expansion difference or non-uniformity in dimensional tolerance at a joint interface can be prevented. Therefore, cracks of the electrode or contamination inside of the chamber can be prevented.

As illustrated in FIG. 5(b), the conductive layer 110 may be coated on a side surface and on a top surface of the upper base 105a, but not limited thereto. By way of example, the conductive layer 110 may not be coated on the side surface and on the top surface of the upper base 105a as long as it is formed on at least a part of the plasma facing surface of the upper base 105a provided in the plasma processing apparatus and has a ground potential by being connected to the grounded processing chamber 100 or capacitively coupled thereto via a capacitor.

(Pattern Evaluation 1)

Figure 6:
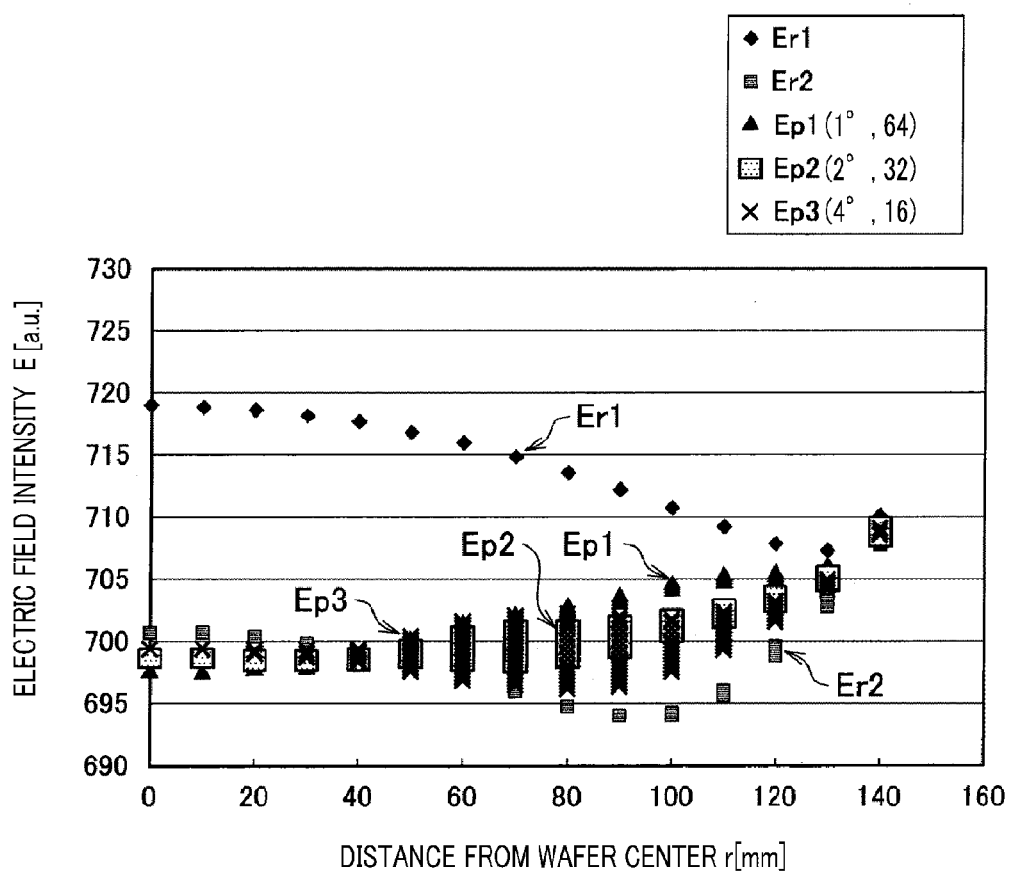
FIG. 6 is a diagram showing electric field intensities of three kinds of dense and sparse patterns.

Now, a pattern evaluation of the conductive layer 110 will be explained. The present inventor has investigated electric field intensities for three kinds of patterns formed at the gradation portion of the conductive layer 110. FIG. 6 shows a result of the investigation.

FIG. 6 shows electric field intensity E (a.u.) with respect to a distance r (mm) from a wafer center when the upper electrode 105 having the above-described conductive layer 110 is used. In this case, the base is also made of alumina, and a high frequency power of about 100 MHz for plasma excitation is applied to the lower electrode. To elaborate, each of the three kinds of patterns has linear comb teeth having three different lengths and protruded inwardly. The three kinds of comb teeth are symmetrically arranged. Here, the comb teeth are arranged in an order of a longest comb tooth, a shortest comb tooth, a middle-length comb tooth, a shortest comb tooth, and a longest comb tooth. Triangular marks Ep1 represent distribution of electric field intensity when patterns having 64 comb teeth, each having an angle of about 1° are formed. Rectangular marks Ep2 represent distribution of electric field intensity when patterns having 32 comb teeth, each having an angle of about 2° are formed. X marks Ep3 represent distribution of electric field intensity when patterns having 16 comb teeth, each having an angle of about 4° are formed.

Further, FIG. 6 also shows distribution of electric field intensity Er1 of the flat electrode shown in FIG. 5(c) and distribution of electric field intensity Er2 of the electrode formed (e.g., by thermal spraying or surface treatment) on the base 905a shown in FIG. 4(a). As can be seen from FIG. 6, in the distributions of electric field intensities Ep1, Ep2, and Ep3 of electrodes having the comb teeth-shaped patterns, the electric field intensities Ep1, Ep2, and Ep3 of electrodes are reduced at central portions of the electrodes, as compared to the electric field intensity Er1 of the flat electrode. Therefore, uniformity of electric field intensities thereof is improved. Moreover, the electric field intensities Ep1, Ep2, and Ep3 are more gently distributed, and their uniformity is higher than that of the electric field intensity Er2 of the electrode on which the surface treatment is performed. In comparison to the electric field intensities Ep1, Ep2, and Ep3 of the comb teeth-shaped patterns, the teeth number decreases in an order of Ep1, Ep2, and Ep3. As the teeth number decreases, electric field intensity does not decrease continuously from an outer portion of the electrode toward an inner portion thereof but tends to be distributed in a W shape. As a result, plasma uniformity is deteriorated. In view of this result, in order to uniformly distribute plasma in a diametric direction and to obtain a uniform etching rate, it may be desirable to set the teeth number of the comb teeth-shaped pattern formed on the conductive layer 110 to be equal to or larger than about 32 and an angle of each comb tooth to be equal to or smaller than about 2°.

Meanwhile, the curves of rectangular marks Ep2 and X marks Ep3 show non-uniformity of a certain range indicated in graphs of FIG. 6 in the circumferential direction. As can be seen from this result, in order to uniformly distribute the plasma in the circumferential direction and to obtain a uniform etching rate, it may be more desirable to set the teeth number of the comb teeth-shaped pattern formed on the conductive layer 110 to be equal to or larger than about 64 and an angle of each comb tooth to be equal to or smaller than about 1°.

(Pattern Evaluation 2)

Figure 7:
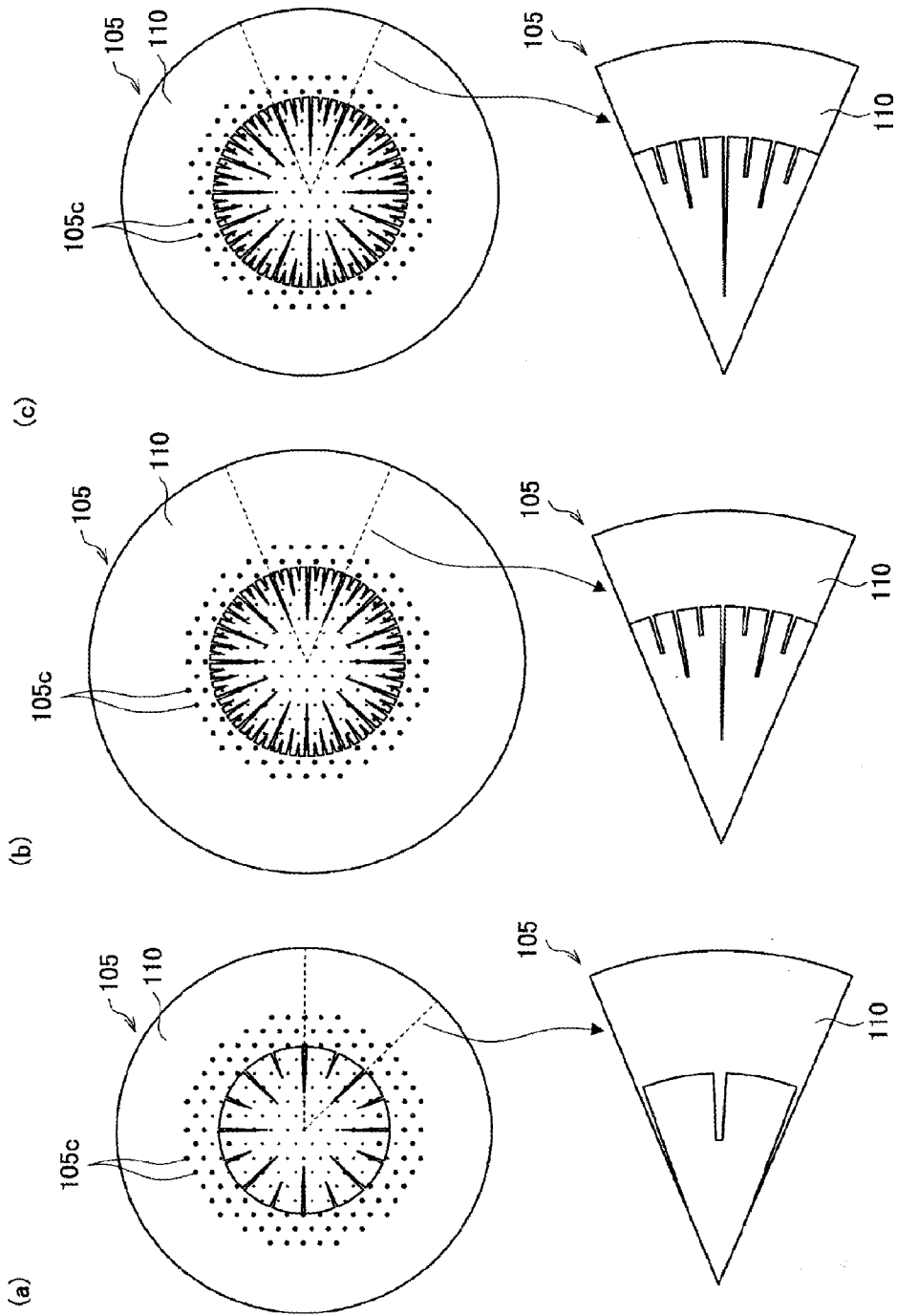
FIG. 7 illustrates various kinds of dense and sparse patterns formed on a conductive layer of an upper electrode in accordance with an illustrative embodiment.

The present inventor has also investigated electric field intensities for other three kinds of patterns of the conductive layer 110. Pattern shapes are illustrated in FIG. 7, and distribution of the electric field intensities corresponding to the respective pattern shapes are shown in FIG. 8.

A dense and sparse pattern formed on the conductive layer 110 shown in FIG. 7(a) has only two types of comb teeth, i.e., short and long. The short and long comb teeth are protruded from an outer portion of the upper electrode 105 toward an inner portion thereof. In FIG. 7(a), 8 long comb teeth and 8 short comb teeth are alternately formed around 360 degrees at a regular interval from an outer peripheral portion of the upper electrode toward the inner portion thereof.

As for dense and sparse patterns of conductive layers 110 shown in FIGS. 7(b) and 7(c), linear comb teeth having three different lengths are protruded inwardly, like the pattern described in FIG. 5(a). Here, 64 comb teeth are radially formed around 360 degrees at a regular interval from an outer peripheral portion of the upper electrode 105 toward an inner portion thereof. The three kinds of comb teeth, i.e., comb teeth having three different lengths, are symmetrically arranged. Here, the comb teeth are arranged in an order of a longest comb tooth, a shortest comb tooth, a middle-length comb tooth, a shortest comb tooth, and a longest comb tooth. The patterns shown in FIGS. 7(b) and 7(c) are different in that the longest comb tooth in FIG. 7(c) is longer than the longest comb tooth in FIG. 7(b).

Figure 8:
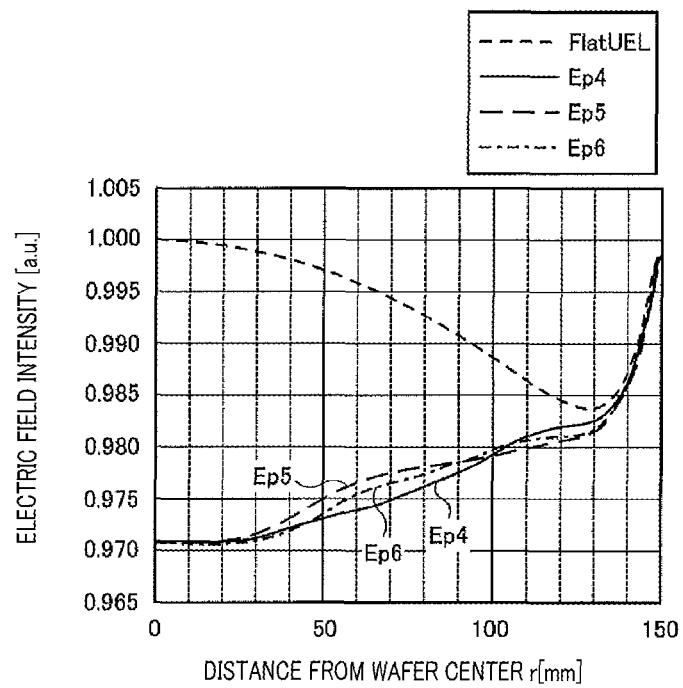
FIG. 8 is a diagram showing electric field intensities of the various kinds of dense and sparse patterns of FIG. 7.

FIG. 8 indicates electric field intensity E (a.u.) with respect to a distance r (mm) from a wafer center when the upper electrode 105 having the conductive layers 110 of the above-described patterns is used. In this case, the base is also made of alumina, and a high frequency power of about 100 MHz for plasma excitation is applied to the lower electrode. Electric field intensity Ep4 of the electrode having the pattern of FIG. 7(a) with a small number of comb teeth tends to be distributed in a slight W shape. As a result, plasma uniformity is deteriorated. Meanwhile, electric field intensities Ep5 and Ep6 of the electrodes having the patterns of FIGS. 7(b) and 7(c) with a larger number of comb teeth are distributed uniformly, as compared to the case of using the electrode having the pattern shown in 7(a). As a result, plasma uniformity can be improved. As can be seen from this result, in order to uniformly distribute plasma and to obtain a uniform etching rate, the teeth number of the comb teeth-shaped pattern formed on the conductive layer 110 needs to be equal to or larger than about 16.

(Pattern Evaluation 3)

Figure 9:
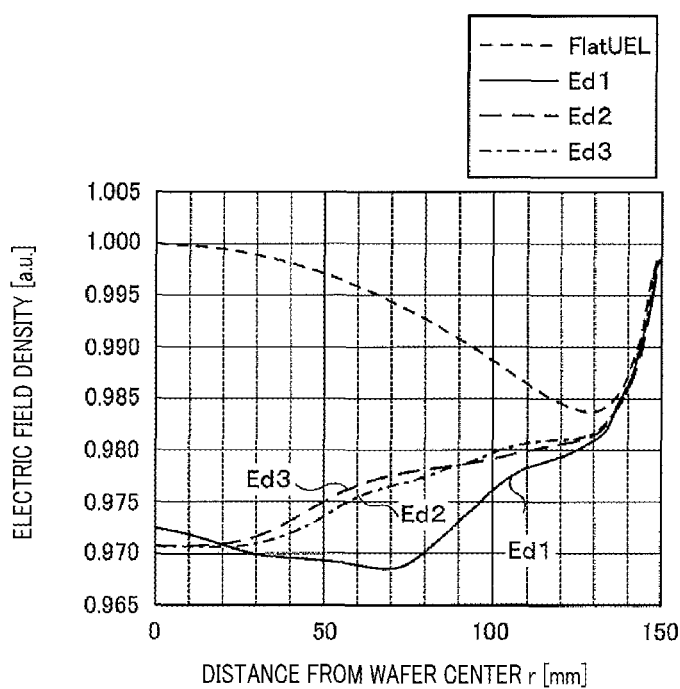
FIG. 9 is a diagram showing an electric field intensity when lengths of comb teeth of the dense and sparse pattern are varied.
Figure 10:
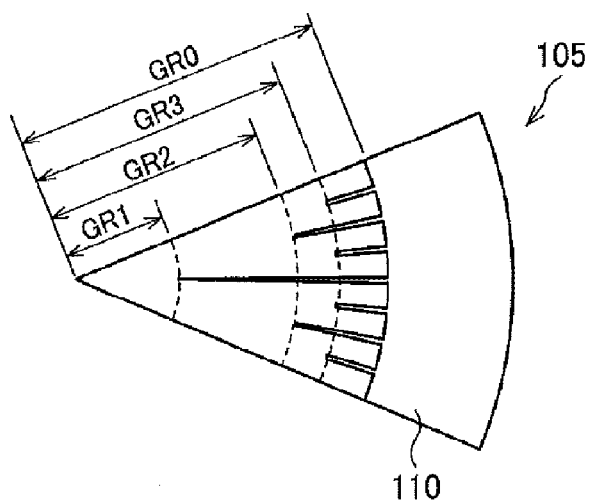
FIG. 10 is a diagram showing lengths of the comb teeth of the dense and sparse pattern.

The present inventor has investigated a variation in distribution of electric field intensity by varying a length of a comb tooth of a dense and sparse pattern formed on the conductive layer 110. The result is shown in FIG. 9. FIG. 9 is a diagram showing a variation in electric field intensity E (a.u.) when 64 comb teeth having three different lengths as depicted in FIGS. 7(b) and 7(c) are formed and distances GR1, GR2, and GR3 (FIG. 10) from a center of the upper electrode 105 to leading ends of the respective comb teeth are varied.

A curve Ed1 of FIG. 9 indicates distribution of electric field intensity when a distance GR1 to a leading end of a longest comb tooth is set to, e.g., about 47.5 mm; a distance GR2 to a leading end of a middle-length comb tooth, e.g., about 80 mm; and a distance GR3 to a leading end of a shortest comb tooth, e.g., about 105 mm. A curve Ed2 indicates distribution of electric field intensity when a distance GR1 to a leading end of a longest comb tooth is set to, e.g., about 55 mm; a distance GR2 to a leading end of a middle-length comb tooth, e.g., about 90 mm; and a distance GR3 to a leading end of a shortest comb tooth, e.g., about 105 mm. A curve Ed3 indicates distribution of electric field intensity when a distance GR1 to a leading end of a longest comb tooth and a distance GR2 to a leading end of a middle-length comb tooth are both set to, e.g., about 100 mm and a distance GR3 to a leading end of a shortest comb tooth is set to, e.g., about 120 mm. That is, the curve Ed3 shows a case of using two different lengths of comb teeth. Further, in all cases, a distance GR0 from a center of the upper electrode 105 to a region where the conductive layer 110 is completely covered is set to be, e.g., about 125 mm. A curve Flat UEL (upper electrode having a flat shape) indicates distribution of electric field intensity when using a flat base without having thereon a conductive layer, as shown in FIG. 4(b).

As can be seen from FIG. 9, if the distances from the center of the upper electrode 105 to the leading ends of the respective comb teeth are set to be short, that is, if the lengths of the comb teeth are set to be long, the same effect as obtained by setting a taper ratio of the taper-shaped dielectric member 920b to be relatively large is achieved. Further, if the lengths of the comb teeth are set to be short, the same effect as obtained by setting the taper ratio to be relatively small is achieved. To be specific, as the lengths of the comb teeth are increased, electric field intensity in the vicinity of the center of the upper electrode 105 is reduced. As a result, more uniform electric field intensity can be obtained.

(Pattern Evaluation 4)

Figure 11:
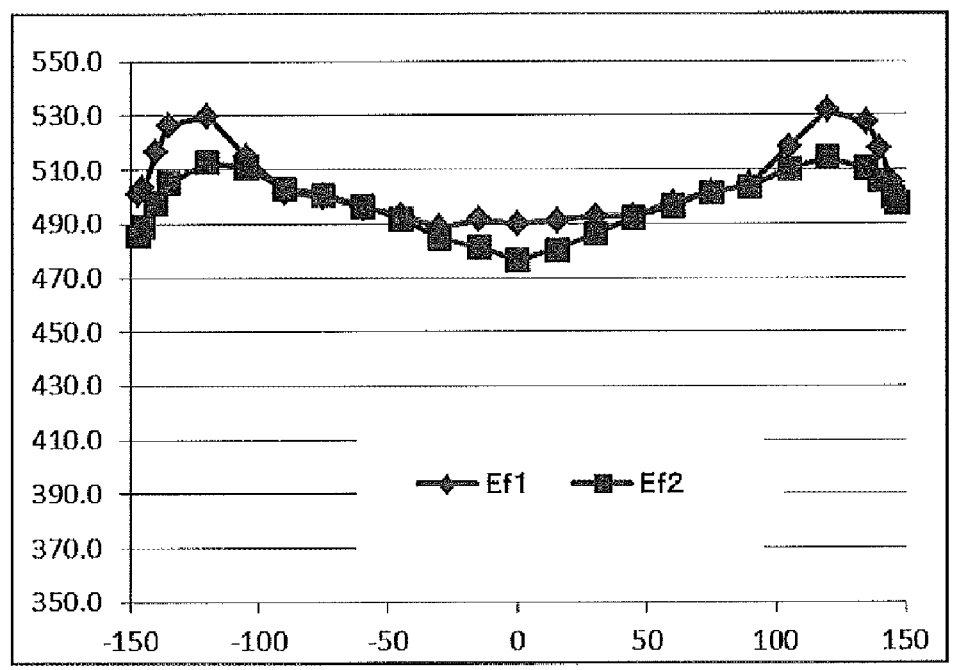
FIG. 11 is a diagram showing an electric field intensity when shapes of the comb teeth of the dense and sparse pattern are varied.

The present inventor has also investigated a variation in distribution of electric field intensity by varying a shape of a comb tooth of a dense and sparse pattern formed on the conductive layer 110. The result is shown in FIG. 11. For the investigation, conditions within the processing chamber 100 are set as follows: a pressure within the processing chamber 100 is set to be, e.g., about 20 mTorr; a processing gas of $C_4F_8/Ar/O_2$ has a flow rate of about 60 sccm/about 400 sccm/about 20 sccm; a high frequency power for plasma generation is set to be, e.g., about 100 MHz/about 1000 W; and a high frequency power for bias control is set to be, e.g., about 3 MHz/about 5500 W.

In FIG. 11, lozenge-shaped marks (◇) Ef1 represent distribution of electric field intensity when distances GR1, GR2, and GR3 to leading ends of respective comb teeth of a dense and sparse pattern are set to be, e.g., about 40 mm, about 75 mm and about 100 mm. As for Rectangular marks (□) Ef2, distances GR1, GR2, and GR3 are also set to be, e.g., about 40 mm, about 75 mm and about 100 mm, which is the same as in the case of Ef1. In addition, Ef2 represent distribution of electric field intensity when transition portions where areas of the conductive layer 110 are continuously varied are formed at a dense and sparse pattern of the conductive layer 110.

Figure 12:
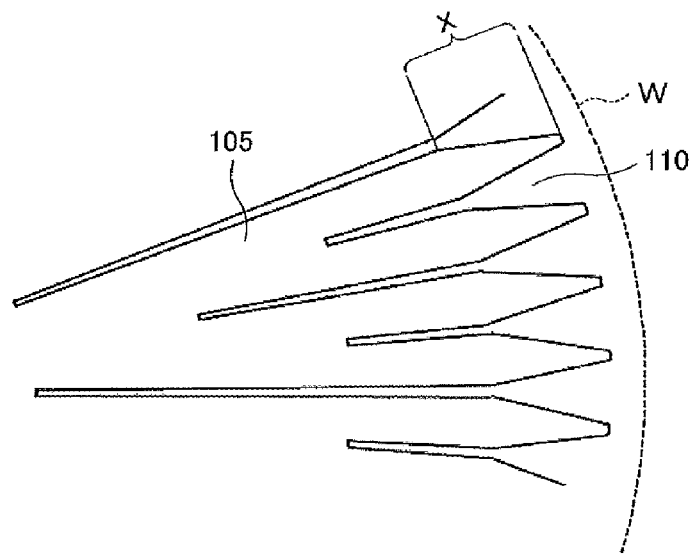
FIG. 12 is a diagram showing a transition portion of the dense and sparse pattern.

By way of example, as illustrated in FIG. 12, the transition portions are formed at a boundary between the conductive layer 110 and the dense and sparse pattern of the conductive layer 110, i.e., at a boundary between the upper base 105a and the conductive layer 110. These transition patterns are protruded from an inner portion of the upper base 105a toward an outer portion thereof such that the conductive layer 110 becomes continuously dense. By way of example, as shown in FIG. 12, the transition portions are formed at an outermost region X of the dense and sparse pattern formed on the conductive layer 110 such that a width of each comb tooth of the conductive layer 110 gradually increases. At this time, the boundary between the dense and sparse pattern of the conductive layer 110 and the conductive layer 110 is positioned at an inner position than an outer peripheral portion of a wafer W mounted on the lower electrode 210. That is, a distance from the center of the upper electrode 105 to an outermost end portion of the dense and sparse pattern of the conductive layer 110 is smaller than a radius of the wafer W.

As depicted in FIG. 11, in the distribution of electric field intensity Ef1 at the pattern having only the comb teeth, rapid peaks of electric field intensity are found near the outer peripheral ends of the wafer W. Meanwhile, in the distribution of electric field intensity Ef2 at the pattern having the transition portions, electric field intensities at the outer peripheral ends of the wafer W are found to be decreased. As a result, uniformity of the distribution of electric field intensity can be improved. As can be seen from this result, it is desirable to provide the transition portions at the boundary between the conductive layer 110 and the dense and sparse pattern of the conductive layer 110 in order to obtain a uniform etching rate and to form uniform distribution of the electric field intensity. Furthermore, it is desirable that outer peripheral ends of the transition portions are positioned at inner positions than the outer peripheral ends of the wafer W. Moreover, in the present illustrative embodiment, although the transition portion is formed in a triangular shape at the boundary of the dense and sparse pattern, the shape of the transition portion may not be limited thereto, and the transition portion may have any shape as long as the ratio of the conductive layer 110 is continuously varied.

(Pattern Evaluation 5)

The present inventor has also investigated an effect of presence or absence of the conductive layer 110 on an etching rate. As for etching conditions, a pressure within the processing chamber 100 is set to be, e.g., about 20 mTorr; a processing gas of $O_2$ has a flow rate of, e.g., about 200 sccm; and a high frequency power for plasma generation is set to be, e.g., about 100 MHz/about 1000 W. Under these conditions, a resist film formed on a wafer W is etched. The result is shown in FIG. 13.

Figure 13:
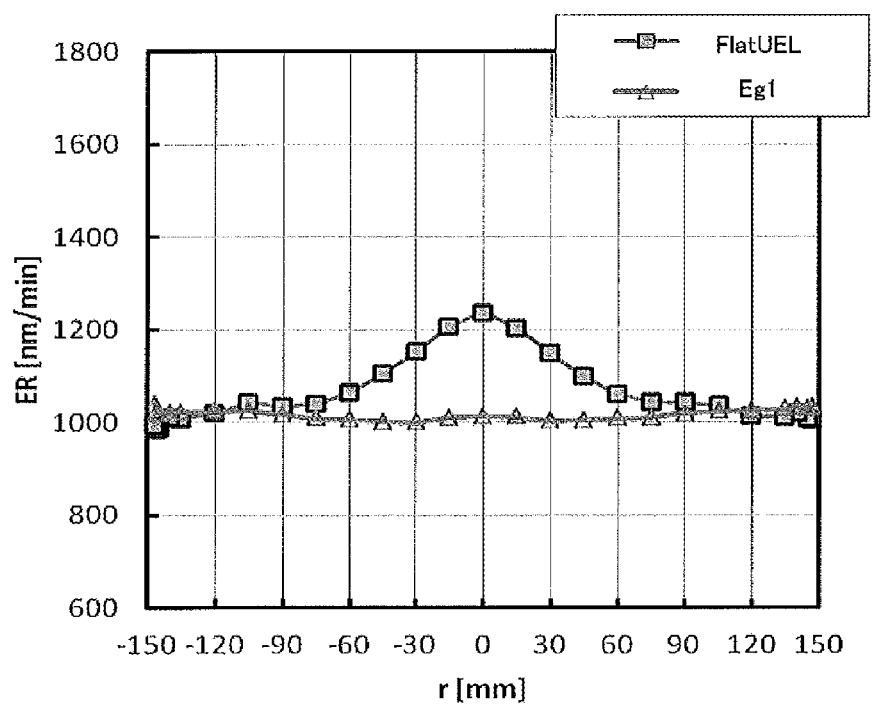
FIG. 13 is a diagram showing an etching rate when a dense and sparse pattern is formed on a conductive layer of an upper electrode in accordance with an illustrative embodiment.

In FIG. 13, rectangular marks Flat UEL represent an etching rate when using an upper electrode 905 having a flat base without having thereon a conductive layer as stated above. Triangular marks Eg1 represent an etching rate when using an upper electrode 105 having transition portions. Distances GR1, GR2, and GR3 to leading ends of respective comb teeth of a dense and sparse pattern formed on the conductive layer 110 having the transition portions are set to be, e.g., about 40 mm, about 75 mm, and about 100 mm. As in the case of Ef2 of FIG. 11, outer peripheral ends of the transition portions are positioned at inner positions than outer peripheral ends of the wafer W.

As can be seen from FIG. 13, when a conductive layer is not formed (Flat UEL), an etching rate at a central portion of the wafer becomes higher than an etching rate at an outer peripheral portion thereof. Meanwhile, when the conductive layer 110 having the dense and sparse pattern is formed, an etching rate at a central portion of the wafer is decreased as compared to the case of Flat UEL. Thus, uniformity of the etching rate is improved. From this result, as for the distribution of the etching rate, it is proved out that the same effect as that obtained by burying a taper-shaped dielectric member can be achieved by forming the comb teeth-shaped pattern at the upper electrode 105.

Moreover, in order to obtain uniform distribution of electric field and an uniform etching rate, it is desirable that the distances GR1, GR2, and GR3 to leading ends of the respective comb teeth are set to be, e.g., about 35 mm to about 50 mm, about 60 mm to about 90 mm, and about 100 mm to about 125 mm, respectively. When forming the transition portions, it is desirable that a distance GR0 is set to be, e.g., about 140 mm to about 145 mm and a length of the region X is set to be, e.g., about 15 mm to about 20 mm. In addition, an average ratio between the conductive layer 110 and the upper base 105a at the transition portion is set to be, e.g., about 40% to about 60%.

(Effect of Gap)

The present inventor has also investigated an effect of a gap on distribution of electric field intensity for the pattern shown in FIG. 5(a). As stated above, in the dense and sparse pattern depicted in FIG. 5(a), 64 comb teeth, each having an angle of about 1°, are radially formed around 360 degrees at a regular interval from the outer peripheral portion of the upper electrode 105 toward the inner portion thereof.

Figure 14:
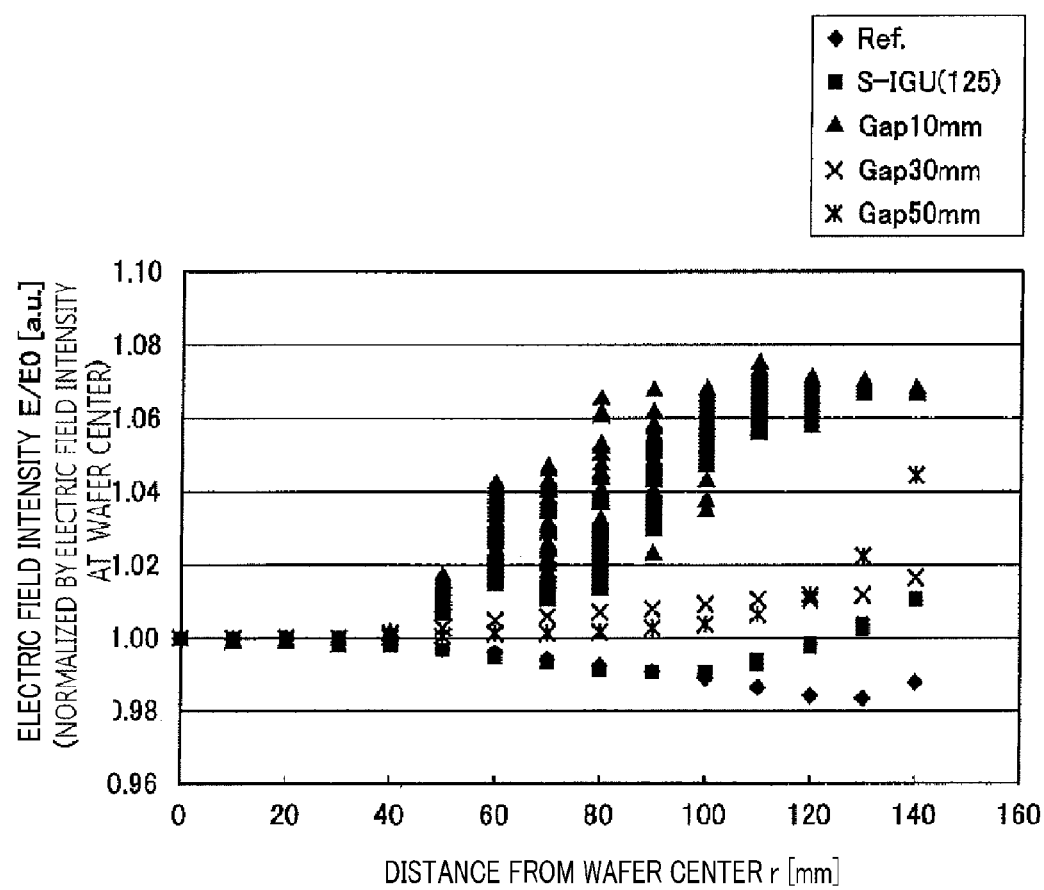
FIG. 14 is a diagram showing a relationship between a gap between upper and lower electrodes and electric field intensity.

FIG. 14 shows electric field intensity E (a.u.) with respect to a distance r (mm) from a wafer center when the upper electrode 105 having the conductive layer 110 of FIG. 5(a) is used. Here, the electric field intensity (E/E0) depicted in FIG. 14 is normalized by the electric field intensity at the wafer center. Further, a gap between the upper electrode 105 and the lower electrode 210 is set to be about 10 mm as indicated by triangular marks, about 30 mm as indicated by X marks, and about 50 mm as indicated by asterisk marks.

As can be seen from the graph (FIG. 14), when the gap is set to be about 30 mm and about 50 mm, non-uniformity in a circumferential direction is found to be low. Meanwhile, when the gap is set to be about 10 mm, there is observed non-uniformity of a certain range indicated in the graph of FIG. 14 in the circumferential direction. When the gap is set to be about 10 mm, the non-uniformity in the circumferential direction becomes remarkable. In a typical etching process, since the gap ranges from about 20 mm to about 50 mm, it is proved that uniformity of electric field intensity can be surely obtained by using a comb teeth-shaped pattern having 64 comb teeth, each having an angle of about 1°. Further, as the distance between the electrodes decreases, the electrode needs to be further subdivided.

MODIFICATION EXAMPLES

Figure 15:
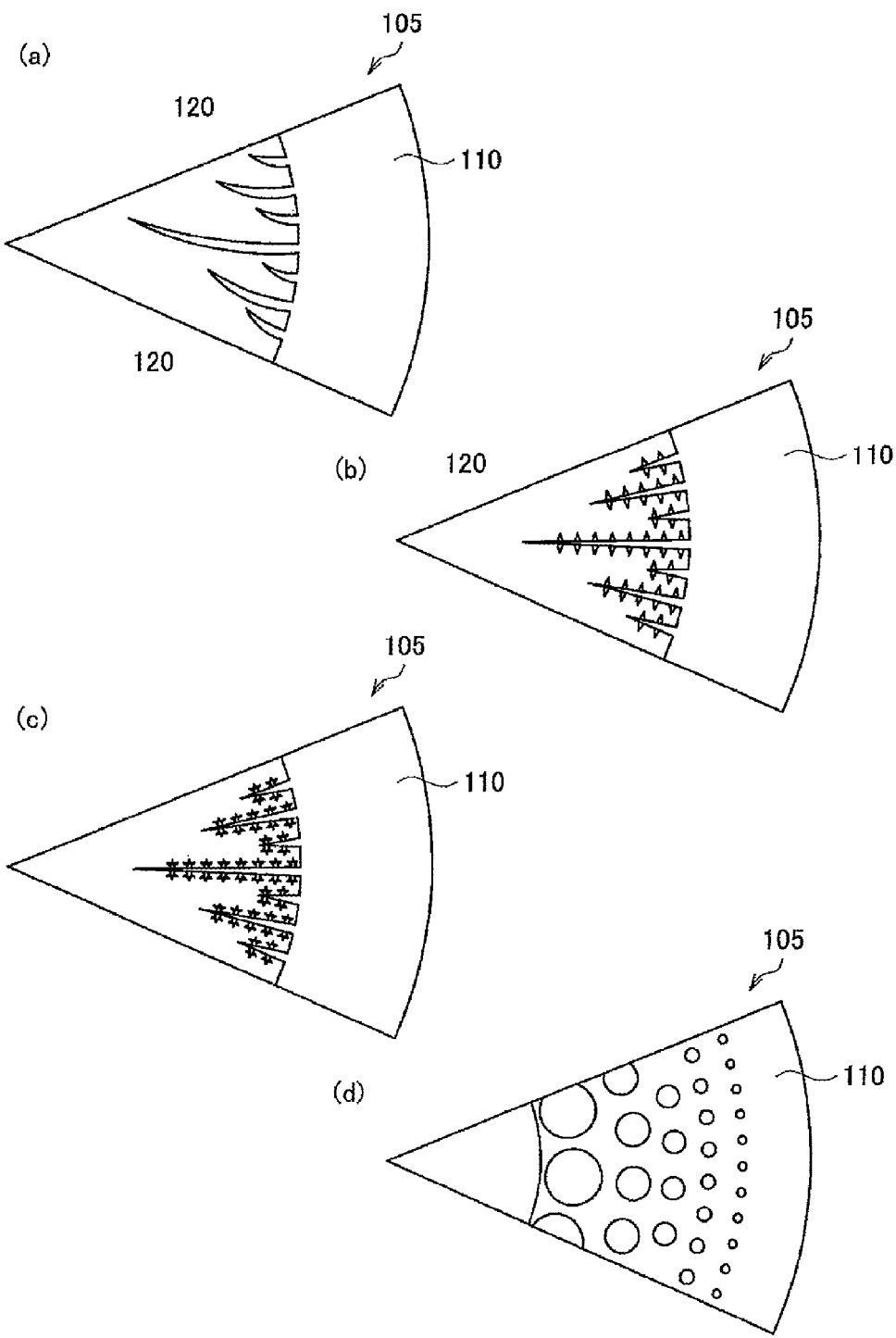
FIG. 15 illustrates various kinds of dense and sparse patterns in accordance with modification examples.

FIG. 15 illustrates modification examples of patterns formed on the conductive layer 110. FIG. 15(a) depicts a pattern having comb teeth of crescent shapes from an outer portion of the upper electrode 105 toward an inner portion thereof. Protruded portions in the middle of the crescent shapes may be arranged toward a same direction or may be symmetrically arranged toward different directions. Here, the comb teeth are arranged in an order of a longest comb tooth, a shortest comb tooth, a middle-length comb tooth, a shortest comb tooth, and a longest comb tooth. In this way, it is also possible to form a dense and sparse pattern formed on the conductive layer 110 such that the pattern at the outer portion of the upper electrode 105 is denser than at the inner portion thereof.

FIG. 15(b) illustrates a pattern similar to a comb teeth-shape protruded from an outer portion of the upper electrode 105 toward an inner portion thereof. This pattern is symmetrically arranged. Further, comb teeth of this pattern are also arranged in an order of a longest comb tooth, a shortest comb tooth, a middle-length comb tooth, a shortest comb tooth, and a longest comb tooth. In this way, it is also possible to form a dense and sparse pattern formed on the conductive layer 110 such that the pattern at the outer portion of the upper electrode 105 is denser than at the inner portion thereof.

FIG. 15(c) illustrates a modification example of FIG. 15(b). This pattern is also symmetrically arranged. Further, comb teeth of this pattern are also arranged in an order of a longest comb tooth, a shortest comb tooth, a middle-length comb tooth, a shortest comb tooth, and a longest comb tooth. In this way, it is also possible to form a dense and sparse pattern formed on the conductive layer 110 such that the pattern at the outer portion of the upper electrode 105 is denser than at the inner portion thereof.

FIG. 15(d) illustrates circular opening patterns arranged from an outer portion of the upper electrode 105 toward an inner portion thereof. Diameters of the circular openings are increased toward the inner portion of the upper electrode 105 from the outer portion thereof. In this way, it is also possible to form a dense and sparse pattern formed on the conductive layer 110 such that the pattern at the outer portion of the upper electrode 105 is denser than at the inner portion thereof.

Further, a dense and sparse pattern may be formed on the conductive layer 110 by controlling the number of an opening to be different between at the outer portion of the upper electrode 105 and at the inner portion thereof.

As described above, in accordance with the illustrative embodiment and modification examples thereof, the upper electrode 105 has the base 105a made of a dielectric material and the conductive layer 110 formed on the surface of the base 105a facing the lower electrode 210. The conductive layer 110 is provided with a dense and sparse pattern such that the pattern at the outer portion thereof is denser than at the inner portion thereof. Accordingly, a combined capacity of the upper electrode 105 and a sheath formed between the upper electrode 105 and plasma becomes larger at the outer portion of the upper electrode 105 than at the inner portion thereof. Thus, like the case of burying a taper-shaped dielectric member in the upper electrode 105, plasma uniformity can be further improved. Furthermore, as compared to the case of burying a taper-shaped dielectric in the upper electrode 105, electric field (electric potential) distribution can be controlled with higher accuracy. Accordingly, uniform plasma can be generated.

While the illustrative embodiments have been described herein, the present disclosure is not limited thereto. The above description of the illustrative embodiments is provided for the purpose of illustration, and it would be understood by those skilled in the art that various changes and modifications may be made without changing technical conception and essential features of the illustrative embodiments. Thus, it shall be understood that all modifications and embodiments conceived from the meaning and scope of the claims and their equivalents are included in the scope of the disclosure.

By way of example, the pattern formed on the conductive layer 110 may not be limited to the aforementioned examples. By adjusting at least one of a teeth number of the comb teeth-shaped pattern, a teeth length thereof, and a teeth angle thereof, a dense and sparse pattern can be formed.

Moreover, the base of the upper electrode may be made of either alumina ($Al_2O_3$) or aluminum nitride (AlN). The conductive layer may be made of aluminum (Al) or tungsten (W).

Further, manufacturing cost can be reduced by forming both the conductive layer and the protection layer by a thermal spraying method. By way of example, the conductive layer may be formed by thermally spraying an aluminum pattern having a thickness of about 100 μm on the base after performing a masking on the base. However, the method for forming the conductive layer and the protection layer may not be limited thereto, and they may be formed by CVD or metalizing method. Moreover, by forming a plate member having a thickness of about 5 mm as the protection layer, the same effect may be achieved.

Moreover, the high frequency power for plasma generation applied from the high frequency power supply can be used in an optimum set-up and just needs to be equal to or higher than about 40 MHz.

Silicon wafers of various sizes may be used as a processing target object.

What is claimed is:

1. An upper electrode for use in a parallel plate type plasma processing apparatus, the upper electrode comprising:
   a base made of a dielectric material; and
   a conductive layer formed on at least a part of a surface of the base facing a lower electrode provided in the plasma processing apparatus,
   wherein the conductive layer has a dense and sparse pattern such that the dense and sparse pattern at an outer portion of the surface of the base facing the lower electrode is denser than at an inner portion thereof.

2. The upper electrode of claim 1,
wherein the dense and sparse pattern includes one of a comb teeth-shaped pattern protruded from the outer portion of the upper electrode toward the inner portion thereof, a crescent-shaped pattern protruded from the outer portion of the upper electrode toward the inner portion thereof, and an opening pattern arranged from the outer portion of the upper electrode toward the inner portion thereof.

3. The upper electrode of claim 2,
wherein the dense and sparse pattern of the conductive layer is formed by adjusting at least one of a teeth number of the comb teeth-shaped pattern, a teeth length thereof, and a teeth angle thereof.

4. The upper electrode of claim 3,
wherein the dense and sparse pattern includes at least three different lengths of comb teeth, and a distance from a center of the upper electrode to a leading end of a longest comb tooth is set to be, e.g., about 35 mm to about 50 mm, a distance from the center of the upper electrode to a leading end of a middle-length comb tooth is set to be, e.g., about 60 mm to about 90 mm, and a distance from the center of the upper electrode to a leading end of a shortest comb tooth is set to be, e.g., about 100 mm to about 125 mm.

5. The upper electrode of claim 1,
wherein a boundary between the conductive layer and the dense and sparse pattern of the conductive layer is positioned at an inner position than an outer peripheral portion of a wafer mounted on the lower electrode.

6. The upper electrode of claim 5,
wherein a transition portion is formed at the boundary between the conductive layer and the dense and sparse pattern of the conductive layer such that the transition portion is protruded from an inner portion of the upper electrode toward an outer portion thereof and the conductive layer becomes continuously dense from the inner portion of the upper electrode toward the outer portion thereof.

7. The upper electrode of claim 1,
wherein the conductive layer has a ground potential.

8. The upper electrode of claim 1,
wherein the base is made of alumina ($Al_2O_3$) or aluminum nitride (AlN).

9. The upper electrode of claim 1, further comprising:
a protection layer covering the base and the conductive layer.

10. The upper electrode of claim 1,
wherein a plurality of gas introducing pipes are provided to pass through the base of the upper electrode.

11. A parallel plate type plasma processing apparatus including an upper electrode and a lower electrode arranged to face each other,
wherein the upper electrode comprising:
a base made of a dielectric material; and
a conductive layer formed on at least a part of a surface of the base facing the lower electrode provided in the plasma processing apparatus,
wherein the conductive layer has a dense and sparse pattern formed such that the dense and sparse pattern at an outer portion of the surface of the base facing the lower electrode is denser than at an inner portion thereof.

12. The parallel plate type plasma processing apparatus of claim 11,
wherein the base is made of alumina ($Al_2O_3$) or aluminum nitride (AlN).

* * * * *